United States Patent
Hertel

(10) Patent No.: US 9,346,114 B2
(45) Date of Patent: May 24, 2016

(54) SUBSTRATE HAVING LASER SINTERED UNDERPLATE

(75) Inventor: Thomas A. Hertel, Canoga Park, CA (US)

(73) Assignee: AEROJET ROCKETDYNE OF DE, INC., Canoga Park, CA (US)

(*) Notice: Subject to any disclaimer, the term of this patent is extended or adjusted under 35 U.S.C. 154(b) by 890 days.

(21) Appl. No.: 12/913,839

(22) Filed: Oct. 28, 2010

(65) Prior Publication Data

US 2011/0268982 A1    Nov. 3, 2011

Related U.S. Application Data

(60) Provisional application No. 61/329,047, filed on Apr. 28, 2010.

(51) Int. Cl.
| | |
|---|---|
| B22F 3/105 | (2006.01) |
| B23K 1/00 | (2006.01) |
| B22F 7/04 | (2006.01) |
| B32B 15/01 | (2006.01) |
| H01L 23/00 | (2006.01) |

(52) U.S. Cl.
CPC ............ *B23K 1/0016* (2013.01); *B22F 3/1055* (2013.01); *B22F 7/04* (2013.01); *B32B 15/017* (2013.01); *H01L 24/83* (2013.01); *B23K 2201/36* (2013.01); *H01L 24/05* (2013.01); *H01L 24/29* (2013.01); *H01L 2224/04026* (2013.01); *H01L 2224/05166* (2013.01); *H01L 2224/05655* (2013.01); *H01L 2224/291* (2013.01); *H01L 2224/29111* (2013.01); *H01L 2224/29144* (2013.01); *H01L 2224/8382* (2013.01); *H01L 2224/8384* (2013.01); *H01L 2224/83447* (2013.01); *H01L 2224/83455* (2013.01); *H01L 2224/83801* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/0132* (2013.01); *H01L 2924/01033* (2013.01); *H01L 2924/01079* (2013.01); *H01L 2924/10253* (2013.01); *H01L 2924/12042* (2013.01); *H01L 2924/351* (2013.01); *Y02P 10/295* (2015.11); *Y10T 428/12007* (2015.01); *Y10T 428/1275* (2015.01)

(58) Field of Classification Search
None
See application file for complete search history.

(56) References Cited

U.S. PATENT DOCUMENTS

| | | |
|---|---|---|
| 5,156,697 A | 10/1992 | Bourell et al. |
| 5,639,070 A | 6/1997 | Deckard |

(Continued)

FOREIGN PATENT DOCUMENTS

| | | |
|---|---|---|
| CN | 101228295 | 7/2008 |
| EP | 2048710 | 5/2009 |

(Continued)

OTHER PUBLICATIONS

Occhionero et al, "Cost-Effective Manufacturing of Aluminum Silicon Carbide (AlSiC) Electronic Packages" proceedings of the IMPAS Advanced Packaging Materials Symposium, (Braselton GA, Mar. 14-17, 1999).

*Primary Examiner* — Daniel J Schleis
(74) *Attorney, Agent, or Firm* — Joel G Landau

(57) ABSTRACT

A substrate includes a metal portion and an underplate that is laser sintered to the metal portion. The metal portion has a melting point that is lower than a sintering temperature of the underplate.

18 Claims, 1 Drawing Sheet

(56) References Cited

U.S. PATENT DOCUMENTS

| | | |
|---|---|---|
| 6,653,741 B2 | 11/2003 | Sreeram et al. |
| 2002/0063117 A1* | 5/2002 | Church et al. ............... 219/200 |
| 2002/0175403 A1 | 11/2002 | Sreeram et al. |
| 2005/0136640 A1* | 6/2005 | Hu et al. ..................... 438/612 |
| 2005/0191200 A1 | 9/2005 | Canzona et al. |
| 2006/0039818 A1 | 2/2006 | Tsai et al. |
| 2006/0102901 A1* | 5/2006 | Im et al. ........................ 257/64 |
| 2006/0115323 A1 | 6/2006 | Coppeta et al. |
| 2007/0009754 A1 | 1/2007 | Dzugan et al. |
| 2007/0175296 A1 | 8/2007 | Subramanian et al. |
| 2009/0020876 A1* | 1/2009 | Hertel et al. ................. 257/745 |
| 2009/0207580 A1 | 8/2009 | Oshika et al. |
| 2010/0055895 A1 | 3/2010 | Zafiropoulo et al. |

FOREIGN PATENT DOCUMENTS

| | | |
|---|---|---|
| JP | 62253762 | 11/1987 |
| JP | 445266 | 2/1992 |
| JP | 07102386 | 4/1995 |
| JP | 2000007456 | 1/2000 |
| JP | 2009038162 | 2/2009 |

* cited by examiner

SUBSTRATE HAVING LASER SINTERED UNDERPLATE

RELATED APPLICATION

This application claims priority to U.S. Provisional Application No. 61/329,047, filed Apr. 28, 2010.

BACKGROUND

This disclosure relates to bonded structures having a robust interface that can withstand elevated temperature processing conditions without delamination.

A bonded structure, such as a silicon die that is bonded to a substrate, typically includes multiple layers of metals that bond the die and the substrate together and provide thermal transfer between the die and package. Manufacturers of such bonded structures typically fabricate the structure at processing temperatures that do not exceed 300° C.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
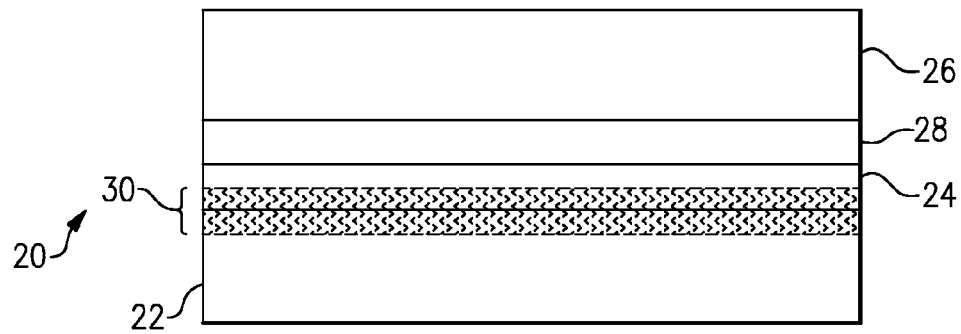
FIG. 1 illustrates an example bonded structure having a sintered interface.

FIG. 1 illustrates an example bonded structure 20, which is not limited to any particular kind or application. The bonded structure 20 includes a structural member 22 having a metal portion, such as aluminum metal in a metal matrix composite. An underplate, metallic layer 24, is located on the structural member 22. The metallic layer 24 is between the structural member 22 and another component 26 to which the structural member 22 is bonded via bonding material 28. That is, the metallic layer 24 is an underplate with regard to the bonding material 28.

The bonding material 28 is not limited to any particular kind but may be a solder material, a diffusion bonding material (e.g., gold and tin) or other suitable material for attaching the structural member 22 and the component 26 together. Depending on the manufacturing of the bonded structure 20, the structural member 22 and metallic layer 24 may be provided as a substrate for subsequent processing to attach the component 26.

The metallic layer 24 is located directly on the structural member 22 and has a sintered interface 30 that serves to facilitate formation of a robust interface between the structural member 22 and the component 26 that can withstand subsequent processing temperatures that are greater than 350° C. without delamination.

The metallic layer 24 may be nickel metal, copper metal, or other suitable metal for the particular application of the bonded structure 20. For instance, the selected metal may serve as a thermal conductor between the structural member 22 and the component 26, facilitate bonding between the structural member 22 and the component 26, and/or serve another desired purpose within the bonded structure 20. In any case, continuous contact between the metallic layer 24 and the structural member 22 facilitates efficient thermal conductivity and good bond strength.

In the illustrated example, the sintered interface 30 forms during processing of the bonded structure 20. For instance, the metallic layer 24 is deposited onto the structural member 22 using a high energy beam. The high energy beam may be a laser or an electron beam that is directed toward a target source of metal that is selected for the metallic layer 24. The high energy beam irradiates the target source material, which heats and evaporates or sublimes, to form a high energy plume of the metal that deposits onto the surface of the structural member 22 to form the sintered interface 30.

The process of applying heat and depositing the source material in a high energy plume causes thermal consolidation of the material to form the sintered interface 30 of the metallic layer 24. Additionally, the use of the high energy beam and target source material does not subject the structural member 22 to the high processing temperatures required to form the high energy plume. In this regard, the material that is deposited as the metallic layer 24 can have a sintering temperature that is higher than the melting temperature of the metal of the structural member 22. For example, aluminum in the structural member has a melting point of approximately 1221° F. (660° C.) while the temperature that the target source material heats up to in order to deposit the metallic layer 24, such as nickel, is much greater. Sintering the metallic layer 24 in situ would otherwise melt the metal portion of the structural member 22.

The sintered interface 30 may be regarded to be the microstructure of the metallic layer 24 and surface region of the structural member 22 that is formed by using the above discussed deposition process, the mechanical interface between the metallic layer 24 and the structural member 22, or another physical characteristic of the sintered interface 30 that is associated with deposition of the metallic layer 24 using a high energy beam. That is, the sintered interface 30 is a physical characteristic of laser-application of the metallic layer 24.

As will be described in more detail below, the sintered interface 30 of the bonded structure 20 is robust and can withstand downstream processing temperatures of 350° C. or greater. In that regard, the sintered interface 30 limits or avoids blistering, cracking, and delamination due to thermal stress from such processing temperatures that might otherwise damage the metallic layer 24 if it were deposited using other methods, such as flame spray and the like. The metallic layer 24 is therefore in continuous contact with the structural member 22 even after a heat history of 350° C. or greater.

Figure 2:
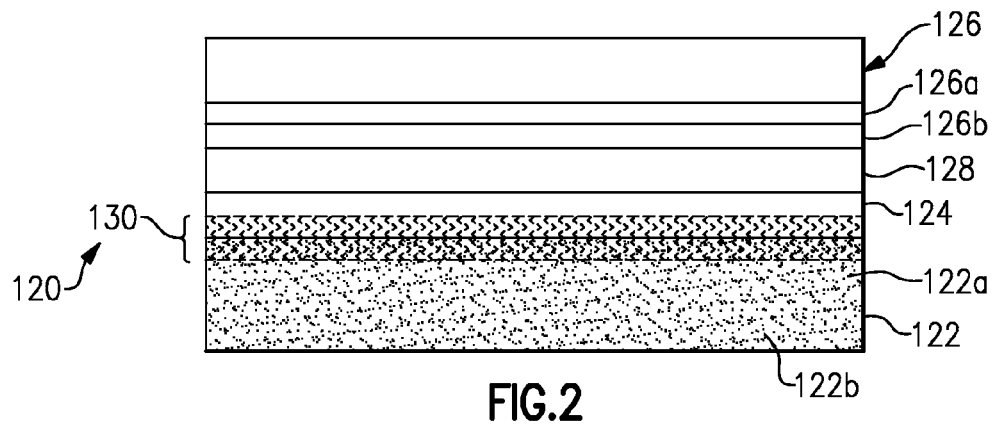
FIG. 2 illustrates an example electronic device having a sintered interface.

FIG. 2 illustrates another bonded structure, which in this example, is an electronic device 120. In this disclosure, like reference numerals designate like elements where appropriate and reference numerals with the addition of one-hundred or multiples thereof designate modified elements that are understood to incorporate the same features and benefits of the corresponding original elements. In this example, the electronic device 120 includes an AlSiC package 122 and a metallic layer 124 located on the AlSiC package 122. The metallic layer 124 may have a thickness of approximately 1-6 micrometers, however, a user may select another desirable thickness to meet the needs of a particular application. The AlSiC package 122 may be a metal matrix composite having silicon carbide reinforcement 122a dispersed in an aluminum metal matrix 122b.

The AlSiC package 122 is bonded to a silicon-containing die 126, such as a silicon die or a silicon carbide die, by way of a bonding material 128. In this example, the silicon-containing die 126 optionally includes layers 126a and 126b. The layers 126a and 126b may be, respectively, titanium metal and nickel metal for facilitating bonding and thermal conductivity between the AlSiC package 122 and the silicon-containing die 126. It is to be understood that the layers 126a and 126b may alternatively be other types of metal layers, depending upon the particular needs of an application.

As above, the metallic layer 124 may be nickel metal, copper metal, or other suitable metal for the particular application. The electronic device 120 includes a sintered interface 130 between the metallic layer 124 and the AlSiC package 122. As also above, the sintered interface 130 is a physical characteristic of the high energy beam deposition process that is used to deposit the metallic layer 124 onto the AlSiC package 122.

The sintered interface 130 is robust and permits downstream high temperature processing of the electronic device 120 without blistering, cracking, or delamination. For instance, the bonding material 128 may be processed at temperatures of 350° C. or greater to fuse the AlSiC package 122 and silicon-containing die 126 together. The sintered interface 130 of the electronic device 120 permits processing at such temperatures without delamination such that the metallic layer 124 and the AlSiC package 122 remain in continuous contact across the interface after a heat history of 350° C. or greater. This facilitates good thermal conductivity between the metallic layer 124 and the AlSiC package 122 such that the die junction temperature can remain low during operation. Furthermore, the sintered interface 130 between the metallic layer 124 and the AlSiC package 122 is approximately an order of magnitude more robust with regard to thermal fatigue than a similar metallic layer that is deposited using other techniques, such as flame spray deposition.

Figure 3:
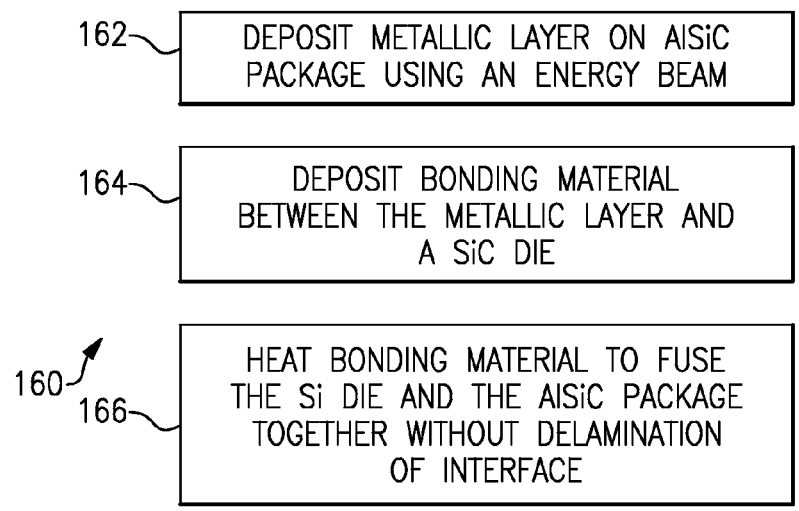
FIG. 3 illustrates an example method for processing an electronic device having a sintered interface.

FIG. 3 illustrates an example method 160 for processing an electronic device, such as the electronic device 120 of FIG. 2. In this example, the method includes a deposition step 162 for depositing the metallic layer 124, a deposition step 164 for depositing the bonding material 128, and a heating step 166 for fusing the silicon-containing die 126 and AlSiC package 122 together without delamination of the interface 130. As an example, the metallic layer 124 is deposited onto the AlSiC package 122 using a high energy beam, such as a laser or electron beam. In the next deposition step 164, the bonding material 128 is deposited between the silicon-containing die 126 and the AlSiC package 122. For instance, the bonding material 128 may be deposited onto the silicon-containing die 126, the AlSiC package 122, or both. The bonding material 128 may include one or more layers of metallic materials that are later heated to form a bond.

The electronic device is heated at the heating step 166 to form the bond between the silicon-containing die 126 and the AlSiC package 122. The heating temperature may be 350° C. or greater and does not cause delamination of the sintered interface 130, as described above. That is, the sintered interface 130 is strong enough to withstand the thermal stresses from the elevated processing temperatures.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A substrate comprising:
a metal portion; and
a metallic underplate of nickel metal that is laser sintered to the metal portion such that the metallic underplate has a sintered interface with the metal portion, the sintered interface having a microstructure that is characteristic of being laser-applied and does not crack, blister or delaminate at a processing temperature greater than 350° C., wherein the metal portion has a melting point that is lower than a sintering temperature of the metallic underplate.

2. The substrate as recited in claim 1, wherein the metal portion is aluminum.

3. The substrate as recited in claim 1, wherein the metal portion is a metal matrix of a composite.

4. The substrate as recited in claim 3, wherein the composite comprises silicon carbide.

5. The substrate as recited in claim 1, wherein the metal portion is aluminum and the metallic underplate is a nickel metal layer in continuous contact with the metal portion.

6. An electronic device comprising:
an electronic device package having a metallic layer thereon such that there is a metallic layer/package interface, the metallic layer selected from a group consisting of nickel metal and copper metal, and the metallic layer/package interface is laser sintered such that the metallic layer has a sintered interface with the electronic device package, the sintered interface having a microstructure that is characteristic of being laser-applied and does not crack, blister or delaminate at a processing temperature greater than 350° C.

7. The electronic device as recited in claim 6, further comprising a silicon-containing die and a bonding material on the metallic layer which bonds the electronic device package and the silicon-containing die together, wherein the electronic device package is an aluminum silicon carbide (AlSiC) package.

8. The electronic device as recited in claim 7 wherein the silicon-containing die includes a titanium metal layer and a nickel metal layer.

9. The electronic device as recited in claim 6, wherein the metallic layer is copper metal.

10. The electronic device as recited in claim 6, wherein the metallic layer is nickel metal.

11. The electronic device as recited in claim 6, wherein the electronic device package is a metal matrix composite having silicon carbide reinforcement dispersed in an aluminum metal matrix.

12. electronic device as recited in claim 6, wherein the metallic layer is a nickel metal layer in continuous contact with the electronic device package.

13. An electronic device comprising:
a silicon-containing die;
an aluminum silicon carbide (AlSiC) package including a nickel metal layer thereon having a sintered interface with the AlSiC package, the sintered interface having a microstructure that is characteristic of being laser-applied and does not crack, blister or delaminate at a processing temperature greater than 350° C.; and a bonding material that bonds the nickel metal layer on the AlSiC package and the silicon-containing die together.

14. The electronic device as recited in claim 13, wherein the nickel metal layer is in continuous contact with the AlSiC package.

15. A bonded structure comprising:
a structural member including aluminum metal;
a metallic layer on the structural member, the metallic layer having a sintered interface with the structural member, the sintered interface having a microstructure that is characteristic of being laser-applied and does not crack, blister or delaminate at a processing temperature greater than 350° C., and the metallic layer is selected from a group consisting of nickel metal and copper metal; and
a bonding material on the metallic layer operable to bond the structural member and another component together.

16. The bonded structure as recited in claim 15, wherein the metallic layer is the nickel metal.

17. The bonded structure as recited in claim 14, wherein the bonding material comprises gold and tin.

18. The bonded structure as recited in claim 15, wherein the metallic layer is the nickel metal and is in continuous contact with the structural member.

* * * * *